(12) United States Patent
Wu

(10) Patent No.: US 12,446,253 B2
(45) Date of Patent: Oct. 14, 2025

(54) FIELD EFFECT TRANSISTOR WITH ADJUSTABLE EFFECTIVE GATE LENGTH

(71) Applicant: GlobalFoundries U.S. Inc., Malta, NY (US)

(72) Inventor: Nan Wu, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 399 days.

(21) Appl. No.: 17/933,304

(22) Filed: Sep. 19, 2022

(65) Prior Publication Data

US 2024/0097029 A1    Mar. 21, 2024

(51) Int. Cl.
*H10D 30/60*    (2025.01)
*H01L 21/225*    (2006.01)
(Continued)

(52) U.S. Cl.
CPC ....... *H10D 30/611* (2025.01); *H01L 21/2252* (2013.01); *H01L 21/28114* (2013.01);
(Continued)

(58) Field of Classification Search
CPC .. H10D 30/611; H10D 30/023; H10D 62/371; H10D 62/378; H10D 64/01; H10D 64/021; H10D 64/518; H10D 64/62; H10D 30/6733; H10D 30/6734; H10D 30/6744; H10D 30/0275; H10D 30/0212;
(Continued)

(56) References Cited

U.S. PATENT DOCUMENTS 5,734,185 A * 3/1998 Iguchi ................ H10D 84/0179
257/E21.345
5,843,815 A * 12/1998 Liaw ...................... H10B 10/15
438/238

(Continued)

OTHER PUBLICATIONS

Balestra et al. "Double-Gate Silicon-on-Insulator Transistor with Volume Inversion: A New Device with Greatly Enhanced Performance," Sep. 9, 1987, vol. 8, Issue 9, pp. 410-412.

(Continued)

*Primary Examiner* — Maliheh Malek
(74) *Attorney, Agent, or Firm* — Francois Pagette; Hoffman Warnick LLC

(57) ABSTRACT

Disclosed is a structure including a field effect transistor (FET). The FET includes, on an insulator layer above a substrate, source/drain regions and a section of a semiconductor layer extending laterally between the source/drain regions. A primary gate structure is made of the insulator layer and a well region in the substrate opposite at least the section of the semiconductor layer extending laterally between the source/drain regions. One or two secondary gate structures are on the semiconductor layer between and near one or both of the source/drain regions, respectively. The FET can further include a patterned conformal dielectric layer, which is on the center of the semiconductor layer between the source/drain regions, and which extends onto the secondary gate structure(s). Also disclosed are methods of operating the structure by biasing the secondary gate structure(s) to adjust the effective gate length of the FET and methods of forming the structure.

14 Claims, 10 Drawing Sheets

(51) Int. Cl.
    *H01L 21/28*     (2025.01)
    *H01L 21/285*     (2006.01)
    *H01L 21/74*     (2006.01)
    *H10D 30/01*     (2025.01)
    *H10D 62/17*     (2025.01)
    *H10D 64/01*     (2025.01)
    *H10D 64/27*     (2025.01)
    *H10D 64/62*     (2025.01)

(52) U.S. Cl.
CPC ...... *H01L 21/28518* (2013.01); *H01L 21/743* (2013.01); *H10D 30/023* (2025.01); *H10D 62/371* (2025.01); *H10D 62/378* (2025.01); *H10D 64/01* (2025.01); *H10D 64/021* (2025.01); *H10D 64/518* (2025.01); *H10D 64/62* (2025.01)

(58) Field of Classification Search
CPC .......................... H10D 30/673; H10D 86/201; H01L 21/2252; H01L 21/28518; H01L 21/743; H01L 21/28114
See application file for complete search history.

(56) References Cited

U.S. PATENT DOCUMENTS

| | | | | |
|---|---|---|---|---|
| 6,534,831 B2 * | 3/2003 | Kato | H10D 30/6727 | 257/532 |
| 6,835,609 B1 * | 12/2004 | Lee | H10D 30/0323 | 438/149 |
| 7,345,330 B2 * | 3/2008 | Rhodes | H01L 21/76895 | 257/292 |
| 7,910,419 B2 * | 3/2011 | Fenouillet-Beranger | H10D 30/6734 | 257/E21.37 |
| 8,004,871 B2 * | 8/2011 | Kaneko | H10B 51/20 | 257/295 |
| 9,196,748 B2 * | 11/2015 | Saito | H10B 43/30 | |
| 9,202,912 B2 * | 12/2015 | Tang | H01L 21/26586 | |
| 9,583,640 B1 * | 2/2017 | Richter | H10B 41/42 | |
| 9,800,204 B2 * | 10/2017 | Kumar | H03F 3/193 | |
| 10,043,900 B1 * | 8/2018 | Bi | H10D 62/115 | |
| 10,121,867 B2 * | 11/2018 | Wu | H10D 30/65 | |
| 10,157,996 B2 * | 12/2018 | Smith | H10D 62/115 | |
| 10,319,827 B2 * | 6/2019 | Smith | H10D 64/015 | |
| 11,127,752 B2 * | 9/2021 | Hsu | H10D 30/0285 | |
| 11,610,843 B2 * | 3/2023 | Ren | H10D 86/201 | |
| 11,715,796 B2 * | 8/2023 | Nakamura | H10D 30/6744 | 257/347 |
| 11,810,951 B2 * | 11/2023 | Peng | H10D 62/151 | |
| 11,956,943 B2 * | 4/2024 | Zhu | H10B 12/05 | |
| 12,211,926 B2 * | 1/2025 | Thei | H10D 64/514 | |
| 12,219,778 B2 * | 2/2025 | Wu | H10D 62/80 | |
| 2003/0209761 A1 * | 11/2003 | Yagishita | H10D 86/01 | 257/E21.415 |
| 2005/0196912 A1 * | 9/2005 | Doris | H10D 86/01 | 438/151 |
| 2005/0269642 A1 * | 12/2005 | Minami | H10D 30/711 | 257/355 |
| 2008/0116514 A1 * | 5/2008 | Zhu | H10D 30/6708 | 257/E21.04 |
| 2008/0185637 A1 * | 8/2008 | Nagaoka | H10D 64/516 | 257/E21.409 |
| 2010/0079169 A1 * | 4/2010 | Kim | H10D 84/84 | 326/120 |
| 2010/0301404 A1 * | 12/2010 | Kawashima | H10D 30/69 | 438/257 |
| 2011/0042756 A1 * | 2/2011 | Hikida | H10D 62/151 | 257/E21.616 |
| 2013/0020632 A1 * | 1/2013 | Disney | H10D 30/0285 | 257/E21.409 |
| 2013/0288445 A1 * | 10/2013 | Ueda | H10D 62/292 | 438/296 |
| 2014/0001518 A1 * | 1/2014 | Huang | H10D 1/64 | 257/E27.03 |
| 2014/0034956 A1 * | 2/2014 | Wu | H10D 30/0227 | 438/285 |
| 2014/0264540 A1 * | 9/2014 | Tan | H10B 41/30 | 438/266 |
| 2015/0129967 A1 * | 5/2015 | Kumar | H01L 21/31111 | 257/350 |
| 2015/0171167 A1 * | 6/2015 | Nourbakhsh | H10D 30/6734 | 257/29 |
| 2015/0187938 A1 * | 7/2015 | Tang | H10D 30/605 | 257/408 |
| 2015/0221758 A1 * | 8/2015 | Miura | H10D 64/254 | 257/76 |
| 2015/0270393 A1 * | 9/2015 | Kumar | H10D 30/611 | 327/437 |
| 2015/0318402 A1 * | 11/2015 | Yamazaki | H10D 30/6729 | 257/43 |
| 2016/0118385 A1 * | 4/2016 | Xie | H10D 64/691 | 257/407 |
| 2016/0149007 A1 * | 5/2016 | Chou | H10D 64/111 | 257/339 |
| 2016/0329434 A1 * | 11/2016 | Ito | H10D 30/6755 | |
| 2017/0200649 A1 * | 7/2017 | Yeo | H10D 84/038 | |
| 2017/0278854 A1 * | 9/2017 | Abe | H10D 30/69 | |
| 2018/0197848 A1 * | 7/2018 | Galy | H10D 89/819 | |
| 2019/0013810 A1 * | 1/2019 | Friedman | G06F 7/501 | |
| 2019/0019876 A1 * | 1/2019 | Smith | H10D 30/0275 | |
| 2019/0019897 A1 * | 1/2019 | Qin | H10D 30/6734 | |
| 2019/0157451 A1 * | 5/2019 | Cortes Mayol | H10D 64/518 | |
| 2019/0288006 A1 * | 9/2019 | Paul | H10D 30/611 | |
| 2019/0378721 A1 * | 12/2019 | Park | H10D 64/518 | |
| 2019/0383667 A1 * | 12/2019 | Assadi | H10F 77/00 | |
| 2020/0220010 A1 * | 7/2020 | Jin | H10D 64/111 | |
| 2021/0193692 A1 * | 6/2021 | Lim | H10D 1/66 | |
| 2021/0217849 A1 * | 7/2021 | Jain | H10D 30/0323 | |
| 2021/0273069 A1 * | 9/2021 | Chu | H10D 30/601 | |
| 2022/0285274 A1 * | 9/2022 | Ren | H01L 23/535 | |
| 2022/0293791 A1 * | 9/2022 | Nakamura | H10D 30/605 | |
| 2022/0367655 A1 * | 11/2022 | Chu | H10D 30/0212 | |
| 2023/0012748 A1 * | 1/2023 | Billoint | G11C 13/004 | |
| 2023/0023179 A1 * | 1/2023 | Ji | H10D 64/671 | |
| 2023/0207697 A1 * | 6/2023 | Xie | H10D 30/6211 | 257/288 |
| 2023/0269948 A1 * | 8/2023 | Kao | H10D 64/512 | |
| 2023/0320070 A1 * | 10/2023 | Zhu | H10B 12/05 | 257/296 |
| 2024/0170551 A1 * | 5/2024 | Lin | H10D 30/696 | |
| 2024/0332417 A1 * | 10/2024 | Melde | H10D 30/0275 | |
| 2024/0429128 A1 * | 12/2024 | Dutta | H01L 21/76898 | |

OTHER PUBLICATIONS

Schippel et al., "A 22nm FDSOI Technology with integrated 3.3V/5V/6.5V Rfldmos Devices for IOT SOC applications," IEEE 2018, 3 pages.

* cited by examiner

FIELD EFFECT TRANSISTOR WITH ADJUSTABLE EFFECTIVE GATE LENGTH

BACKGROUND

Field of the Disclosure

The present disclosure relates to semiconductor structures and, more particularly, to embodiments of semiconductor structure including a field effect transistor (FET), embodiments of a method of operating the FET, and to embodiments of a method of forming the semiconductor structure.

Description of Related Art

Key factors considered in modern integrated circuit design include, but are not limited to, performance improvement, size scaling, and power consumption. For example, on-resistance of a field effect transistor (FET) can be reduced to improve performance (e.g., increase switching speed). One technique for reducing on-resistance is to reduce the gate length of the FET field effect transistor (FET). However, reducing gate length is typically limited by the technology node at issue and by the optical resolution of the photolithographic technique employed for gate patterning.

SUMMARY

Disclosed herein are embodiments of a structure. The structure can include an insulator layer on a semiconductor substrate. The structure can further include, on the insulator layer, source/drain regions and a section of a semiconductor layer extending laterally between the source/drain regions. The section of the semiconductor layer that extends laterally has end portions adjacent to the source/drain regions and a center portion positioned laterally between the end portions. The structure can further include a primary gate structure and at least one secondary gate structure. The primary gate structure can include the insulator layer and a well region in the semiconductor substrate adjacent to the insulator layer opposite at least the section of the semiconductor layer between the source/drain regions. The at least one secondary gate structure can be on at least one of the end portions.

Also disclosed herein are method embodiments for operating and for forming the structure.

Specifically, disclosed herein is an operating method. This method can include providing a structure, as described above. That is, the provided structure can include an insulator layer on a semiconductor substrate. The structure can further include, on the insulator layer, source/drain regions and a section of a semiconductor layer extending laterally between the source/drain regions. The section of the semiconductor layer that is positioned laterally between the source/drain regions can have end portions adjacent to the source/drain regions and a center portion positioned laterally between the end portions. The structure can further include a primary gate structure and at least one secondary gate structure. The primary gate structure can include the insulator layer and a well region in the semiconductor substrate adjacent to the insulator layer opposite at least the section of the semiconductor layer between the source/drain regions. The at least one secondary gate structure can be on at least one of the end portions. This method embodiment can further include biasing the at least one secondary gate structure and concurrently biasing the primary gate structure, wherein the biasing of the at least one secondary gate structure reduces an effective gate length.

Also disclosed herein is a manufacturing method. This method can include providing a partially completed structure including a semiconductor substrate, an insulator layer on the semiconductor substrate, and a semiconductor layer on the insulator layer. This method can further include forming the structure, as described above. That is, the formed structure can include, on the insulator layer, source/drain regions and a section of a semiconductor layer extending laterally between the source/drain regions. The section of the semiconductor layer that is positioned laterally between the source/drain regions can have end portions adjacent to the source/drain regions and a center portion positioned laterally between the end portions. The formed structure can further include a primary gate structure and at least one secondary gate structure. The primary gate structure can include the insulator layer and a well region in the semiconductor substrate adjacent to the insulator layer opposite at least the section of the semiconductor layer between the source/drain regions. The at least one secondary gate structure can be on at least one of the end portions.

BRIEF DESCRIPTION OF THE SEVERAL VIEWS OF THE DRAWINGS

The present disclosure will be better understood from the following detailed description with reference to the drawings, which are not necessarily drawn to scale and in which.

DETAILED DESCRIPTION

As mentioned above, on-resistance of a field effect transistor (FET) can be reduced in order to improve performance (e.g., in order to increase switching speed). One technique for reducing on-resistance is to reduce the gate length of the FET field effect transistor (FET). However, reducing gate length is typically limited by the technology node at issue and by the optical resolution of the photolithographic technique employed for gate patterning.

In view of the foregoing, disclosed herein are embodiments of a semiconductor structure including a field effect transistor (FET) with an adjustable effective gate length. The FET can include, on an insulator layer above a semiconductor substrate, source/drain regions and a section of a semiconductor layer that extends laterally between the source/drain regions. The FET can further include a primary gate structure made up of the insulator layer and a contacted well region in the semiconductor substrate opposite at least the section of the semiconductor layer between the source/drain regions. The FET can further include one or two secondary gate structures on the section of the semiconductor layer between the source/drain regions and, particularly, on end portion(s) thereof near one or both of the source/drain regions, respectively. The FET can further include a patterned conformal dielectric layer (e.g., a patterned self-aligned silicide blocking layer), which covers a center portion of the section of the semiconductor layer between the source/drain regions, and which further extends onto the secondary gate structure(s). Also disclosed are method embodiments for forming the semiconductor structure and for operating the FET and, particularly, for biasing the secondary gate structure(s) to adjust the effective gate length of the FET.

Figure 1A:
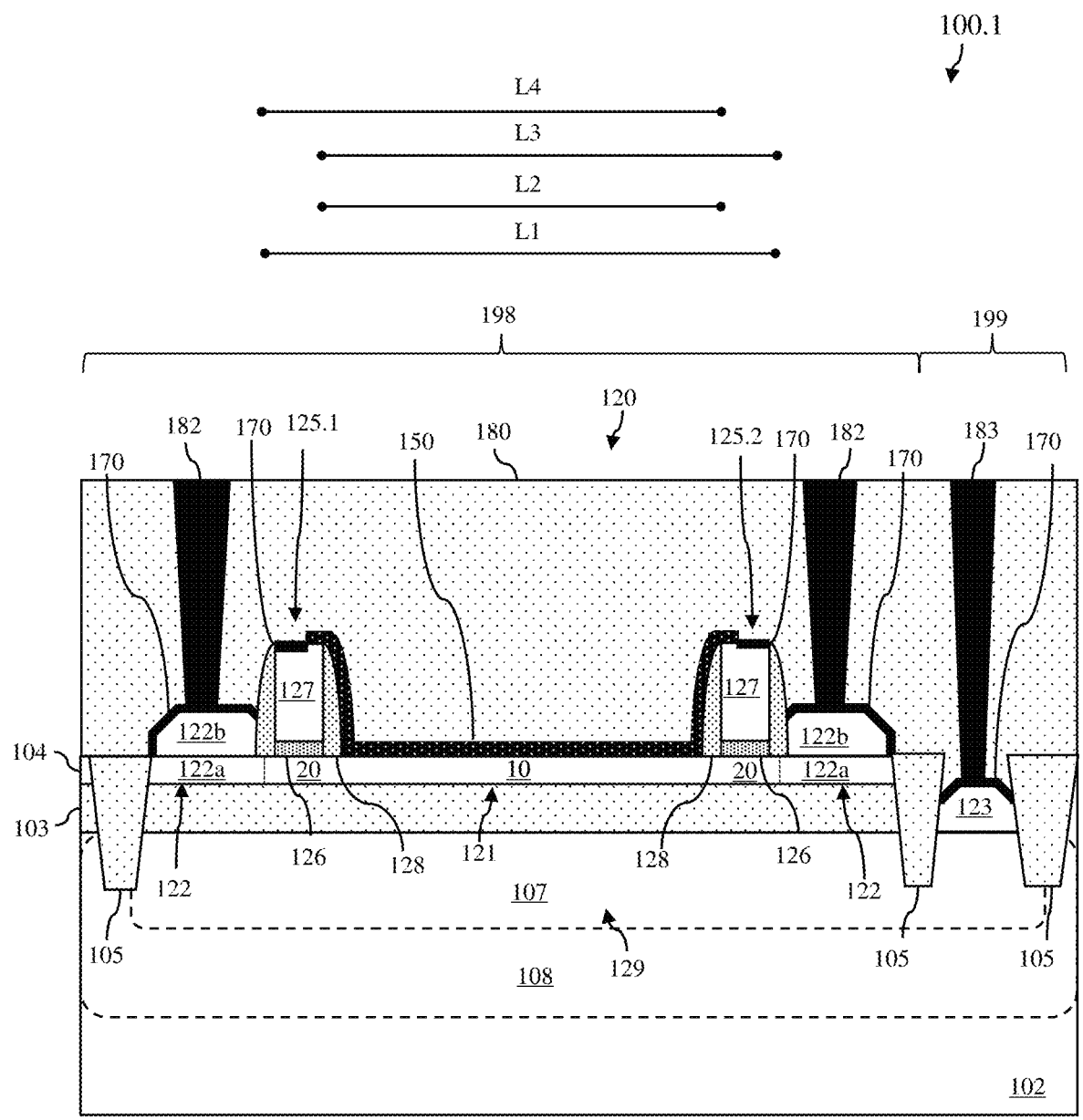
FIGS. 1A and 1B are cross-section and layout diagrams, respectively, illustrative of a disclosed embodiment of a semiconductor structure including a FET with an adjustable gate length.
Figure 1B:
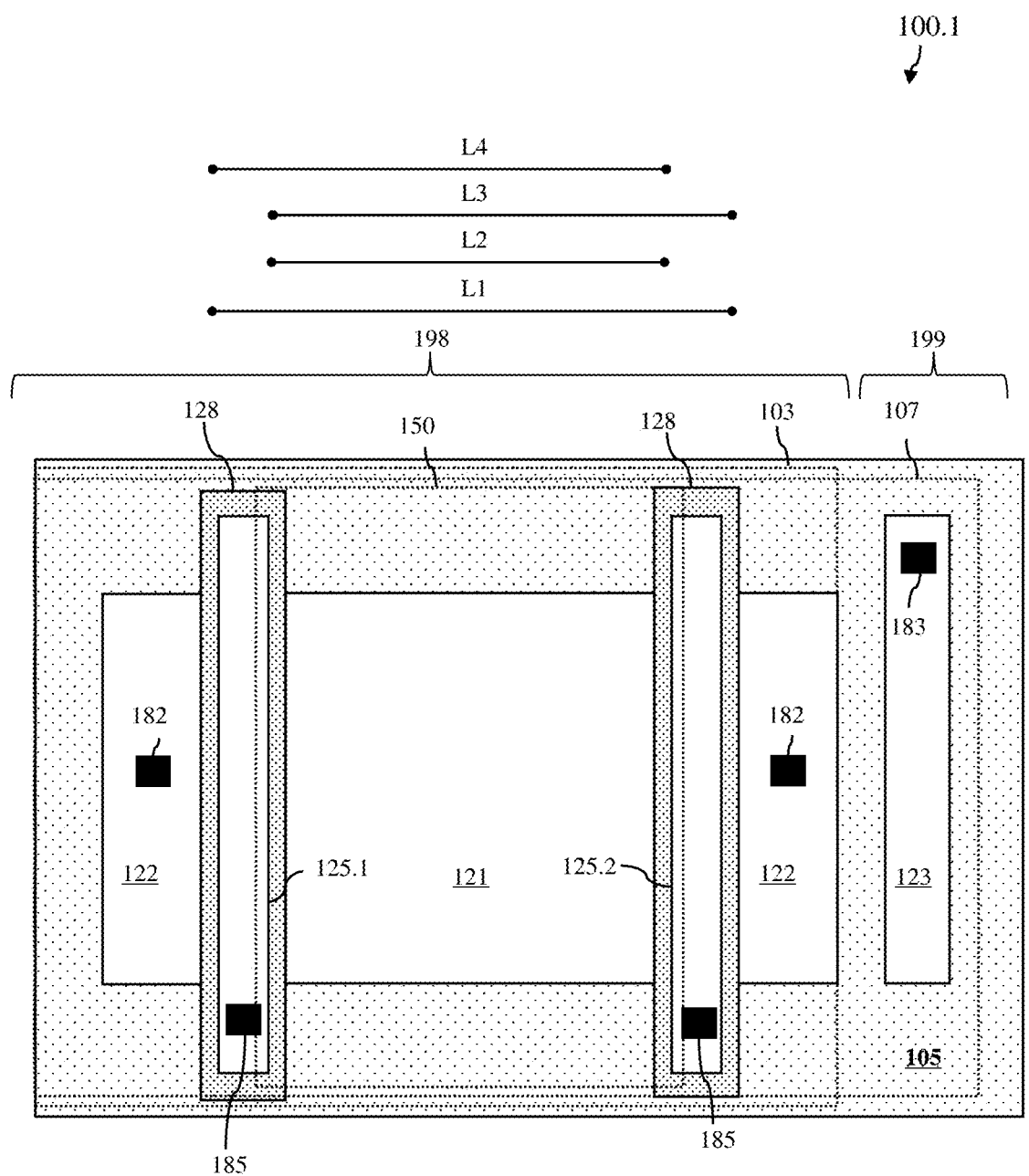
Figure 2A:
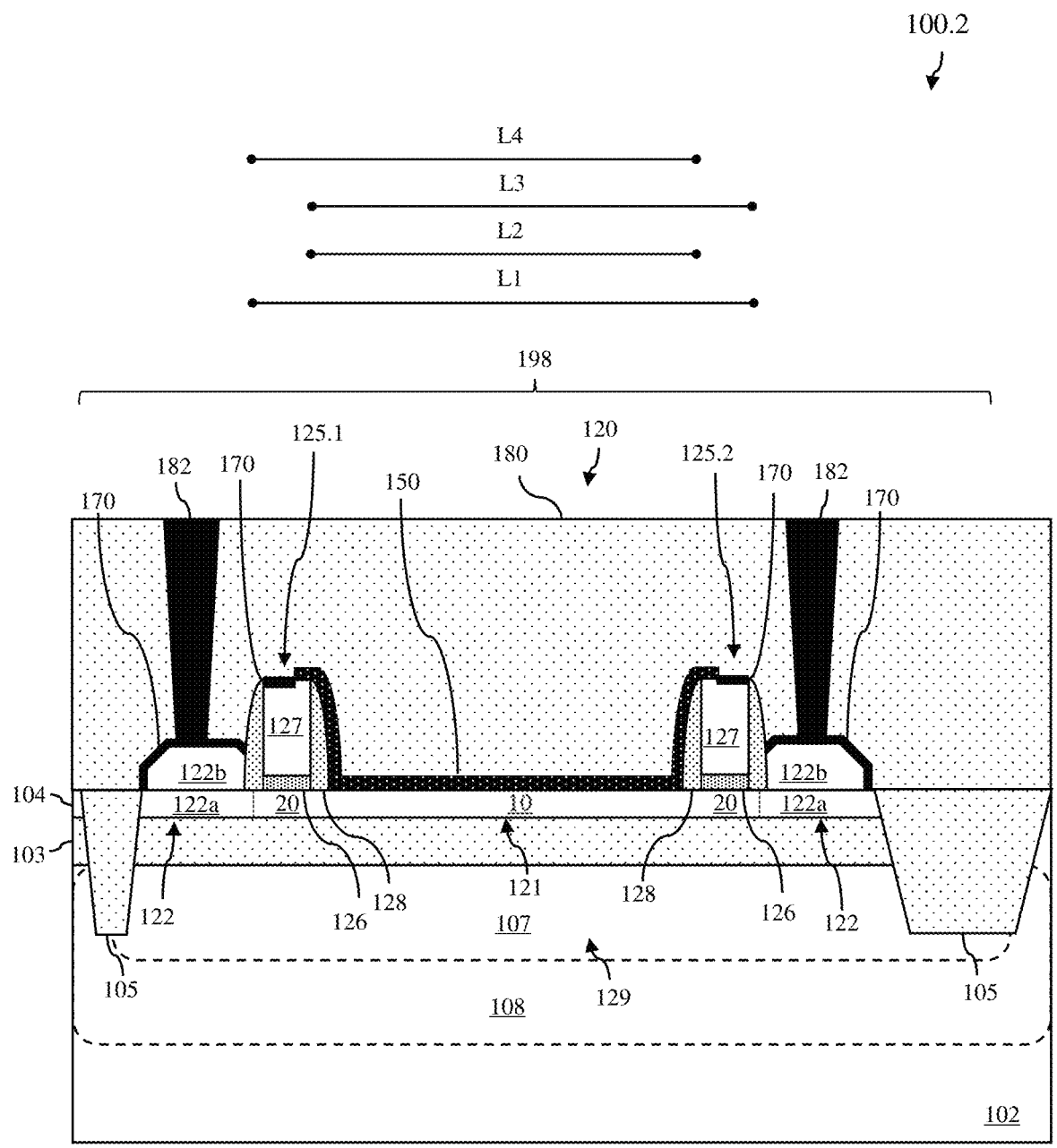
FIGS. 2A and 2B are cross-section and layout diagrams, respectively, illustrative of another disclosed embodiment of a semiconductor structure including a FET with FIGS. 3A and 3B are circuit diagrams including an N-type field effect transistor (NFET) and a P-type field effect transistor (PFET), respectively, configured as in the disclosed semiconductor structure embodiments.
Figure 2B:
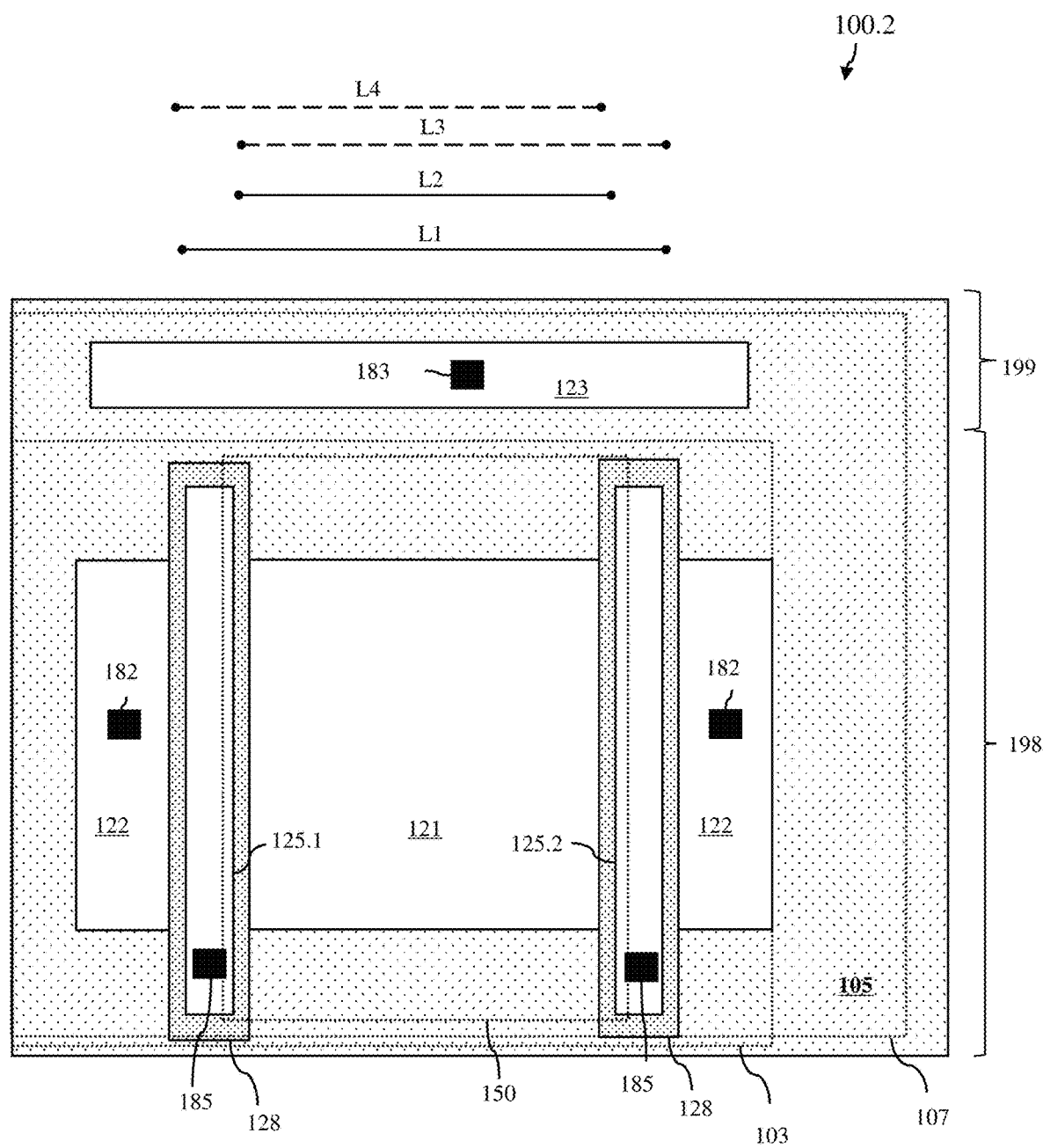

More particularly, FIGS. 1A and 1B are cross-section and layout diagrams, respectively, of a disclosed embodiment of a semiconductor structure 100.1 including a field effect transistor (FET) with an adjustable effective gate length. FIGS. 2A and 2B are cross-section and layout diagrams, respectively, of another disclosed embodiment of a semiconductor structure 100.2 including a FET 120 with an adjustable effective gate length.

Referring to FIGS. 1A-1B and 2A-2B, the semiconductor structure 100.1-100.2 can include a monocrystalline semiconductor substrate 102 (e.g., a monocrystalline silicon (Si) substrate or a monocrystalline substrate of some other suitable semiconductor material, such as silicon germanium (SiGe), germanium (Ge), etc.). The semiconductor structure 100.1-100.2 can further include an insulator layer 103 on the semiconductor substrate 102. The insulator layer 103 can be a silicon dioxide ($SiO_2$) layer (also referred to herein as a buried oxide (BOX) layer) or a layer of some other insulator material suitable for use in a back gate structure. The insulator layer 103 can be relatively thin (e.g., 50 nm or less). The semiconductor structure 100.1-100.3 can further include a monocrystalline semiconductor layer 104 on the insulator layer 103. The semiconductor layer 104 can be a monocrystalline Si layer or a monocrystalline layer of some other suitable semiconductor material (e.g., SiGe, Ge, etc.). The monocrystalline semiconductor layer 104 can also be also relatively thin (e.g., 22 nm or less).

The semiconductor structure 100.1-100.2 can be formed, for example, using an advanced semiconductor-on-insulator technology platform (e.g., a fully depleted silicon-on-insulator (FDSOI) technology platform). Those skilled in the art will recognize that, in advanced semiconductor-on-insulator technology platforms such as in the FDSOI technology platform, a semiconductor structure is typically formed on a hybrid semiconductor substrate. Such a hybrid semiconductor substrate typically includes a base semiconductor substrate, which is monocrystalline in structure, and both semiconductor-on-insulator areas and hybrid areas on the base semiconductor substrate. Each semiconductor-on-insulator area includes a monocrystalline semiconductor layer on an insulator layer above the base semiconductor substrate. Each hybrid area includes a monocrystalline epitaxial semiconductor layer immediately adjacent to the top surface of the base semiconductor substrate. Top surfaces of the semiconductor-on-insulator and hybrid areas can be essentially co-planar. Alternatively, the top surfaces of the semiconductor-on-insulator areas and the hybrid areas can be at different levels relative to the top surface of the semiconductor substrate (i.e., not co-planar, as illustrated). Those skilled in the art will recognize that in FDSOI technology platforms the semiconductor-on-insulator areas are typically used as semiconductor-on-insulator areas (e.g., areas for fully depleted planar field effect transistors (FETs)). The hybrid areas are typically used to access and, particularly, to contact well regions in the substrate below the semiconductor-on-insulator areas so the well regions can be biased and, thus, function as back gate structures (e.g., for primary FET operation or for threshold voltage tuning). The hybrid areas can also be used for bulk areas.

The semiconductor structure 100.1-100.2 can include a FET 120. The FET 120 can be either an N-type field effect transistor (NFET) or a P-type field effect transistor (PFET). The FET 120 can include an active device region in a semiconductor-on-insulator area 198 and a well contact region 123 within a hybrid area 199 positioned laterally adjacent to the semiconductor-on-insulator area 198.

The semiconductor structure 100.1-100.2 can further include isolation regions 105. The isolation regions 105 can define the shape of the active device region in the semiconductor-on-insulator area 198, can define the shape of the hybrid area 199, and can further physically separate and electrically isolate the active device region in the semiconductor-on-insulator area 198 from the well contact region 123 in the hybrid area 199. The isolation regions 105 can, for example, be shallow trench isolation (STI) regions. That is, the isolation regions 105 can each include a trench that extends from the top surface of the semiconductor layer 104 and through the insulator layer 103 and into the semiconductor substrate 102. The trench can be filled with one or more layers of isolation material (e.g., silicon dioxide ($SiO_2$) or any other suitable isolation material). Such isolations regions 105 can further laterally surround the FET 120 so as to electrically isolate the FET 120 from other devices of features on the semiconductor substrate 102.

The semiconductor structure 100.1-100.2 can further include a well region 107 in the semiconductor substrate 102 in the semiconductor-on-insulator area 198 below the active device region and separated therefrom by the insulator layer 103 and further extending laterally into the hybrid area 199 so as to be below and in contact with the well contact region 123. As illustrated, the bottom of the well region 107 extends deeper in the substrate than the bottom of the isolation regions 105. Optionally, the semiconductor structure 100.1-100.2 can further include a buried well region 108 within the semiconductor substrate below and wider than the well region 107. For purposes of this disclosure, a well region refers to a doped region of the semiconductor substrate. This doped region can be doped (e.g., by dopant implantation or otherwise) so as to have a specific type of conductivity (as discussed in greater detail below). The well region 107 and the buried well region 108 can have different type conductivities so that the buried well region 108 can electrically isolate the well region 107 from a lower portion of the semiconductor substrate 102. Thus, for example, the well region can be an N-type well region (Nwell) and the buried well region 108 can be a P-type well region (Pwell) or vice versa. The well contact region 123 can be a semiconductor region having the same type conductivity as the well region 107 at a relatively high conductivity level. Thus, for example, if the well region 107 is a Pwell, the well contact region 123 can be a P+ contact region; whereas, if the well region 107 is an Nwell, the well contact region 123 can be an N+ contact region. The well contact region 123 can, for example, be an in situ doped monocrystalline epitaxial semiconductor layer on the top surface of the semiconductor substrate 102. The epitaxial semiconductor layer of the well contact region 123 can include one or more layers of semiconductor material including the same semiconductor material as the semiconductor substrate 102 or, alternatively, some other suitable semiconductor material.

The FET 120 can further include source/drain regions 122 above the insulator layer 103 in the active device region. Each source/drain region 122 can include an optional doped portion 122a of the semiconductor layer 104. The optional doped portion 122a can extend the full thickness of the semiconductor layer 104 so that it is above and immediately adjacent to the insulator layer 103, as illustrated. Alternatively, the optional doped portion 122a can extend into the semiconductor layer 104 to some depth above the level of the top surface of the insulator layer 103. Each source/drain region 122 can include an epitaxial semiconductor layer 122b (e.g., an in situ doped epitaxial semiconductor layer) above and immediately adjacent to the semiconductor layer 104. The epitaxial semiconductor layer 122b can be aligned above an optional doped portion 122a of the semiconductor layer 104, as illustrated. Thus, each source/drain region includes an optional lower portion within the semiconductor layer and a raised upper portion above the semiconductor layer. The epitaxial semiconductor layer 122b include one or more layers of monocrystalline semiconductor material including the same semiconductor material as the semiconductor layer 104 or, alternatively, some other suitable semiconductor material.

As mentioned above, the FET 120 can be either an N-type field effect transistor (NFET) or a P-type field effect transistor (PFET). For an NFET, the epitaxial semiconductor layers 122b of the source/drain regions can have N-type conductivity at a relatively high conductivity levels (e.g., so as to be N+ source/drain regions) and the optional doped portions 122a of the semiconductor layer 104 below can have N-type conductivity at the same or lesser conductivity levels. For a PFET, the epitaxial semiconductor layers 122b of the source/drain regions 122 can have P-type conductivity at relatively high conductivity levels (e.g., so as to be P+ source/drain regions) and the optional doped portions 122a of the semiconductor layer 104 below can have P-type conductivity at the same or lesser conductivity levels.

The FET 120 can further include a section 121 of the semiconductor layer 104 on the insulator layer 103 in the active device region and extending laterally between and in contact with the source/drain regions 122. This section 121 of the semiconductor layer can have end portions 20 adjacent to the source/drain regions 122 and a center portion 10 extending between the end portions 20. This section 121 of the semiconductor layer 104 can be an intrinsic portion. That is, it can be undoped. Alternatively, this section 121 can have a conductivity type that is different than that of the source/drain regions 122 and at a relatively low conductivity level. Thus, for an NFET, the section 121 of the semiconductor layer 104 can be either an intrinsic portion or a P− portion. For a PFET, the section 121 of the semiconductor layer 104 can be either an intrinsic portion or an N− portion.

It should be noted that the semiconductor structures 100.1 of FIGS. 1A-1B and 100.2 of FIGS. 2A-2B vary with respect to the layout of the semiconductor-on-insulator area 198 and the hybrid area 199 and, particularly, with respect to the well contact region 123 relative to the active device region. More specifically, as illustrated in FIGS. 1A-1B, in the semiconductor structure 100.1 the hybrid area 199 and, thereby the well contact region 123 is located at one end of the FET 120 along its length (i.e., adjacent to one of the source/drain regions 122 and separated therefrom by an isolation region 105). As illustrated in FIGS. 2A-2B, in the semiconductor structure 100.2 the hybrid area 199 and, thereby the well contact region 123 is located on one side of the FET 120 along its width (e.g., adjacent to the channel region and separated therefrom by an isolation region 105).

The FET 120 can further include a primary gate structure 129 and, particularly, a primary gate structure 129 that is a back gate structure. That is, the primary gate structure 129 can include the well region 107, which effectively functions as the primary gate conductor, and the insulator layer 103, which separates the well region 107 from the section 121 of the semiconductor layer 104 that extends between the source/drain regions 122 and which effectively functions as the primary gate dielectric. The well contact region 123 can be contacted (e.g., see contact 183) in order to access the well region 107 for applying a gate voltage to the primary gate structure 129. The well region 107 and the well contact region 123 can have N-type or P-type conductivity regardless of whether the FET 120 is an NFET or a PFET. The type of conductivity of the well region can vary depending upon the desired threshold voltage type. For example, an NFET will have a lower threshold voltage (VT) with an N-type primary gate structure than a P-type primary gate structure and vice versa.

The FET 120 can further include at least one secondary gate structure 125.1-125.2. More specifically, as mentioned above, a section 121 (e.g., an intrinsic or low-doped portion) of the semiconductor layer 104 extends laterally between the source/drain regions 122 in the semiconductor-on-insulator area 198. End portions 20 of that section 121 are adjacent to the source/drain regions 122, respectively, and a center portion 10 extends therebetween. The secondary gate structure(s) 125.1-125.2 can, for example, be positioned above and immediately adjacent to the end portion(s) 20 traversing the semiconductor layer widthwise and, optionally, extending onto the adjacent isolation regions 105. Each secondary gate structure 125.1-125.2 can include a gate stack including a gate dielectric layer 126 and a gate conductor layer 127 on the gate dielectric layer 126. In some embodiments, the secondary gate structure(s) can be high-K/metal gate structures. For example, the gate dielectric layer 126 can include an optional interfacial layer (e.g., a silicon oxynitride layer) and a high-K gate dielectric layer on the interfacial layer. Those skilled in the art will recognize that a high-K dielectric layer refers to a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide. The gate conductor layer 127 can include, for example, at least one metal or metal alloy layer on the high K gate dielectric layer. The metal or metal alloy layer(s) can include, for example, a metal or metal alloy capping layer and an additional metal or metal alloy material layer suitable for dipole formation on the metal or metal alloy capping layer). The gate conductor layer 127 can, optionally, also include a doped polysilicon layer (e.g., N-doped for an NFET or P-doped for a PFET) on the metal or metal alloy layer. Alternatively, the secondary gate structure(s) can include any other suitable combination of gate dielectric and gate conductor materials.

Each secondary gate structure 125.1-125.2 can further have opposing sidewalls and gate sidewall spacers 128 positioned laterally adjacent to the opposing sidewalls. The gate sidewall spacers 128 on a given secondary gate structure 125.1 or 125.2 will include inner and outer gate sidewall spacers and, particularly, an outer sidewall spacer on one side adjacent to a source/drain region 122 and an inner sidewall spacer on the opposite side (i.e., close to the center portion 10). The gate sidewall spacers 128 can include one or more layers of dielectric spacer material covering the opposing sidewalls of the secondary gate structure(s) 125.1-125.2. The dielectric spacer material can be, for example, silicon dioxide, silicon oxynitride, or any other suitable dielectric spacer material.

For purposes of illustration, the figures show two secondary gate structures 125.1-125.2 having essentially the same gate length. However, it should be understood that the figures are not intended to be limiting and, alternatively, the FET 120 could include a single secondary gate structure or a pair of secondary gate structures having different gate lengths.

The FET 120 can further include a relatively thin conformal dielectric layer 150 above and immediately adjacent the center portion 10 of the semiconductor layer 104 and further extending laterally onto the inner sidewall spacer 128 and, optionally, at least partially over each secondary gate structure 125.1-125.2. If, as illustrated, the structure includes a pair of secondary gate structures 125.1-125.2, this dielectric layer 150 can extend laterally entirely across the center portion 10 and onto both secondary gate structures 125.1-125.2. However, it should be understood that, if the structure only includes a single secondary gate structure, the dielectric layer 150 would extend from one source/drain region across the semiconductor layer and onto the secondary gate structure on the opposite side. In any case, the dielectric layer 150 can be, for example, a self-aligned silicide blocking layer made of, for example, silicon nitride, silicon carbon nitride, or any other suitable self-aligned silicide blocking material that is different from the dielectric material of the gate sidewalls spacers 128.

The FET 120 can further include metal silicide layers 170 on top surfaces of the source/drain regions 122 and, particularly, on the epitaxial semiconductor layers 122b and on the top surface of the well contact region 123. Additionally, if the gate conductor layer 127 of the secondary gate structure(s) 125.1-125.2 includes a doped polysilicon layer that is not completely covered by the dielectric layer 150, then the secondary gate structure(s) 125.1-125.2 could also include a metal silicide layer 170 at least partially covering the top surface thereof. The metal silicide layers 170 could be, for example, layers of cobalt silicide, nickel silicide, tungsten silicide, titanium silicide, or a silicide of any other suitable metal or metal alloy material.

The semiconductor structure 100.1-100.2 can further include one or more middle-of-the-line (MOL) dielectric layers 180. The MOL dielectric layer(s) 180 can cover and, particularly, can have a bottom surface above and immediately adjacent to the isolation regions 105-106, the metal silicide layers 170 (e.g., on the source/drain regions 122, well contact region 123, and secondary gate structure(s)), the outer gate sidewall spacer(s) 128 and any other features not covered by the dielectric layer 150, and the dielectric layer 150. The MOL dielectric layer(s) 180 can include, for example, an etch stop layer and a blanket interlayer dielectric (ILD) material layer on the etch stop layer. The etch stop layer can be, for example, a relatively thin conformal silicon nitride layer or a relatively thin conformal layer of some other suitable etch stop material. The ILD material layer can be, for example, a blanket layer of silicon dioxide, a doped silicon glass (e.g., phosphosilicate glass (PSG) or borophosphosilicate glass (BPSG)), or a blanket layer of any other suitable ILD material. The MOL dielectric layer(s) 180, as illustrated, can fill the space that is above the horizontal portion of the dielectric layer 150 above the center portion 10 of the section 121 of the semiconductor layer 104 that extends laterally between the source/drain regions.

The semiconductor structure 100.1-100.2 can further include MOL contacts that extend through the one or more middle-of-the-line (MOL) dielectric layers 180 to the terminals of the FET 120. For example, see the contact 183 to the well contact region 123 and, thereby to the primary gate structure 129, contact(s) 185 to the secondary gate structure(s) 125.1-125.2, and the contacts 182 to the source/drain regions 122. To minimize parasitic capacitance such contacts can, optionally, be offset. For example, as illustrated, the secondary gate contact(s) 185 can land on the secondary gate structures above the isolation region 105 as opposed to above the active device region. It should, however, be understood that the figures are not intended to be limiting. Alternatively, the contacts could be placed differently and/or the contacted features could include more than one contact landing thereon.

Figure 3A:
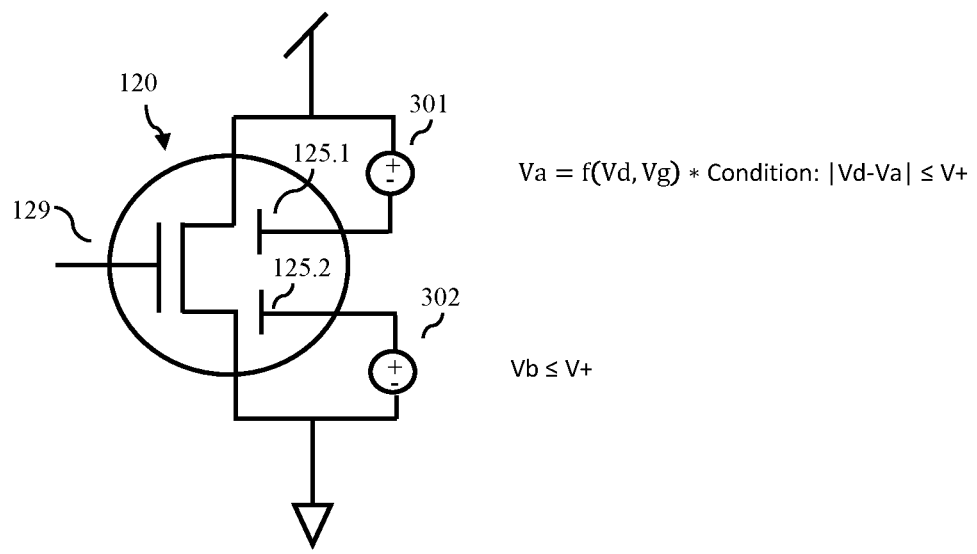
Figure 3B:
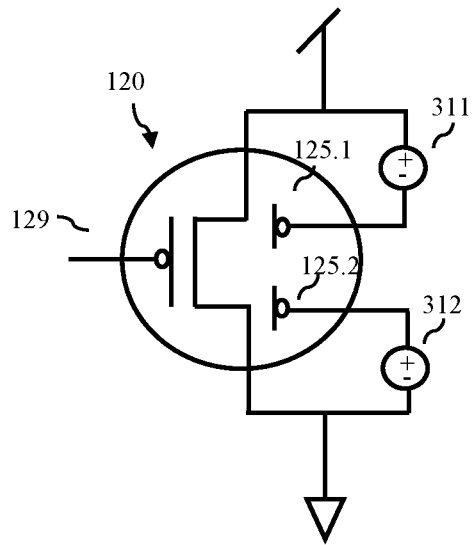

One technique for operation of the semiconductor structure 100.1-100.2 can include concurrently biasing and, particularly, concurrently applying constant gate voltages to the secondary gate structures 125.1-125.2 and these gate voltages can be set to cause the end portions 20 (i.e., the end portions of that section 121 of the semiconductor layer 104 aligned below the secondary gate structures and positioned laterally adjacent to the source/drain regions 122) to be held in a continuous conductive state. Establishing this continuous conductive state in the end portions 20, reduces the effective gate length of the FET 120 from the length (L1) of the full distance between the source/drain regions 122 to the length (L2) corresponding to the distance from one secondary gate structure to the other and, particularly, from the conductive end portion under one secondary gate structure to the conductive end portion under the other secondary gate structure. While the end portions 20 are conductive and when the FET 120 is to be switched to an on-state, another gate voltage can be selectively applied to the primary gate structure 129 and set at a voltage level that is sufficient to cause the center portion 10 (i.e., the portion of that section 121 of the semiconductor layer 104 between the end portions 20) to become conductive, thereby turning on the FET 120. As a result, on-resistance is reduced and thus, so is the switching speed. FIG. 3A is a circuit diagram including an NFET that is configured as the FET 120 described above and further configured to operate according to this technique. That is, as shown in the circuit structure of FIG. 3A, the secondary gate structures 125.1-125.2 of the NFET can further be electrically connected to a pair of voltage sources 301-302, which are configured to apply constant positive voltage biasing to the secondary gate structures. The positive voltages applied by the voltage sources 301-302 can be set so that the secondary gate structures 125.1-125.2 cause the end portions 20 to be held in continuous conductive states. FIG. 3B is a similar circuit diagram including a PFET that is configured as the FET 120 described above and further configured to operate as described above. That is, as shown in the circuit structure of FIG. 3B, the secondary gate structures 125.1-125.2 of the PFET can further be electrically connected to a pair of voltage sources 311-312, which are configured to provide constant ground or negative voltage biasing to the secondary gate structures. The negative or ground voltages applied by the constant voltage sources 311-312 can be set so that the secondary gate structures 125.1-125.2 cause the end portions 20 to be held in continuous conductive states.

Figure 4A:
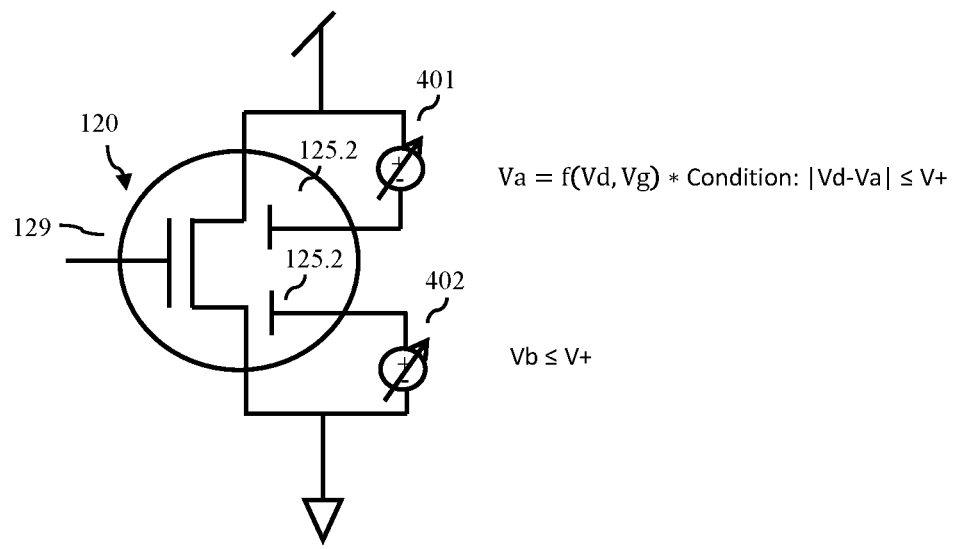
FIGS. 4A and 4B are alternative circuit diagrams including an N-type field effect transistor (NFET) and a P-type field effect transistor (PFET), respectively, configured as in the disclosed semiconductor structure embodiments.
Figure 4B:
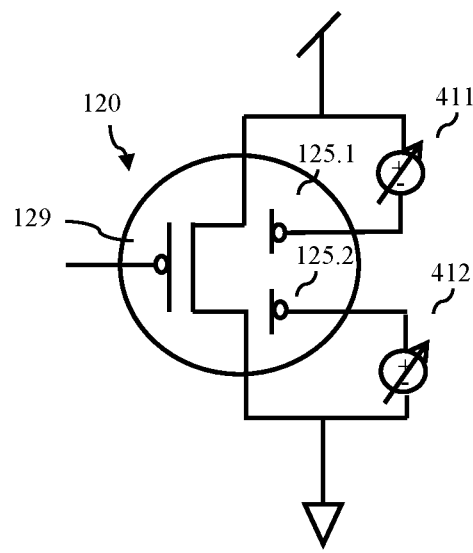

Another technique for operation of the semiconductor structure 100.1-100.2 can include selectively and independently biasing the secondary gate structures 125.1-125.2 using discrete voltage sources and, particularly, providing a gate voltage to both, to only one, or to none of the secondary gate structures 125.1-125.2 through discrete voltage sources. If applicable, the gate voltage provided to any secondary gate structure can be set to establish a conductive state in a corresponding end portion 20 (i.e., an end portion of that section 121 of the semiconductor layer 104 aligned below the secondary gate structure and positioned laterally adjacent to a source/drain region 122). By selectively and independently biasing the secondary gate structures to make both, only one, or none of the end portions 20 conductive, the effective gate length of the FET 120 can be left at the length (L1) of the full distance between the source/drain regions 122, reduced to the length (L2) corresponding to the distance from one secondary gate structure to the other (e.g., if both end portions 20 are made conductive by the secondary gate structure), or reduced to some length (L3) or (L4) between L1 and L2 (e.g., if only one end portion 20 is made conductive). It should be noted that if the actual gate lengths of the secondary gate structures 125.1-125.2 are essentially the same, then L3 would be essentially equal to L4. However, as mentioned above, optionally the actual gate lengths of the secondary gate structures 125.1-125.2 could be different. In this case, L3 and L4 would be different. Thus, this technique would allow the effective gate length of the FET 120 to be selectively adjusted between four different values. In any case, once gate voltages (if any) are applied to the secondary gate structures and when the FET 120 is to be switched to the on-state, another gate voltage can be selectively applied to the primary gate structure 129 and set at a voltage level that is sufficient to cause the center portion 10 and (if necessary, any end portions that are not already conductive) to become conductive, thereby turning on the FET 120. In this case, on-resistance can be selectively reduced and thus, so can switching speed. FIG. 4A is a circuit diagram including an NFET that is configured as the FET 120 described above and further configured to operate according to this technique. That is, as shown in the circuit diagram of FIG. 4A, the secondary gate structures 125.1-125.2 can be electrically connected to a pair of independently controllable (i.e., variable) voltage sources 401-402 to provide on-demand positive voltage biasing thereto. A positive voltage selectively and independently applied by a voltage source to a secondary gate structure can be set to ensure that the secondary gate structure causes the end portion 20 below to be in a conductive state, otherwise the end portion will remain non conductive until acted upon by the primary gate structure. FIG. 4B is a circuit diagram including a PFET that is configured as the FET 120 described above and further configured to operate according to this technique. That is, as shown in the circuit diagram of FIG. 4B, the secondary gate structures 125.1-125.2 can be electrically connected to a pair of controllable (i.e., variable) voltage sources 411-412 to provide on-demand ground/negative voltage biasing thereto. A ground or negative voltage selectively applied by a voltage source to a secondary gate structure can be set to ensure that the secondary gate structure causes the end portion 20 below to be in a conductive state, otherwise the end portion will remain non-conductive until acted upon by the primary gate structure.

Those skilled in the art will recognize that the actual voltage applied to any given one of the secondary gate structures to establish a conductive state in the semiconductor material below will depend on whether that secondary gate structure is at the source region of the FET or the drain region of the FET and on the other terminal bias conditions. For example, consider FIG. 3A. In this case, the first secondary gate voltage (Va) applied to the first secondary gate structure 125.1 (which is adjacent to the drain region) to establish conductivity should be a function of the drain voltage (Vd) and the primary gate voltage (Vg) and should be subject to the condition that the absolute value of Vd−Va is less than or equal to some selected high positive voltage amount (e.g., 1.8V). Furthermore, the second secondary gate voltage (Vb) applied to the second secondary gate structure 125.2 (which is adjacent to the source region) should be less than or equal to the same high positive voltage amount.

Figure 5:
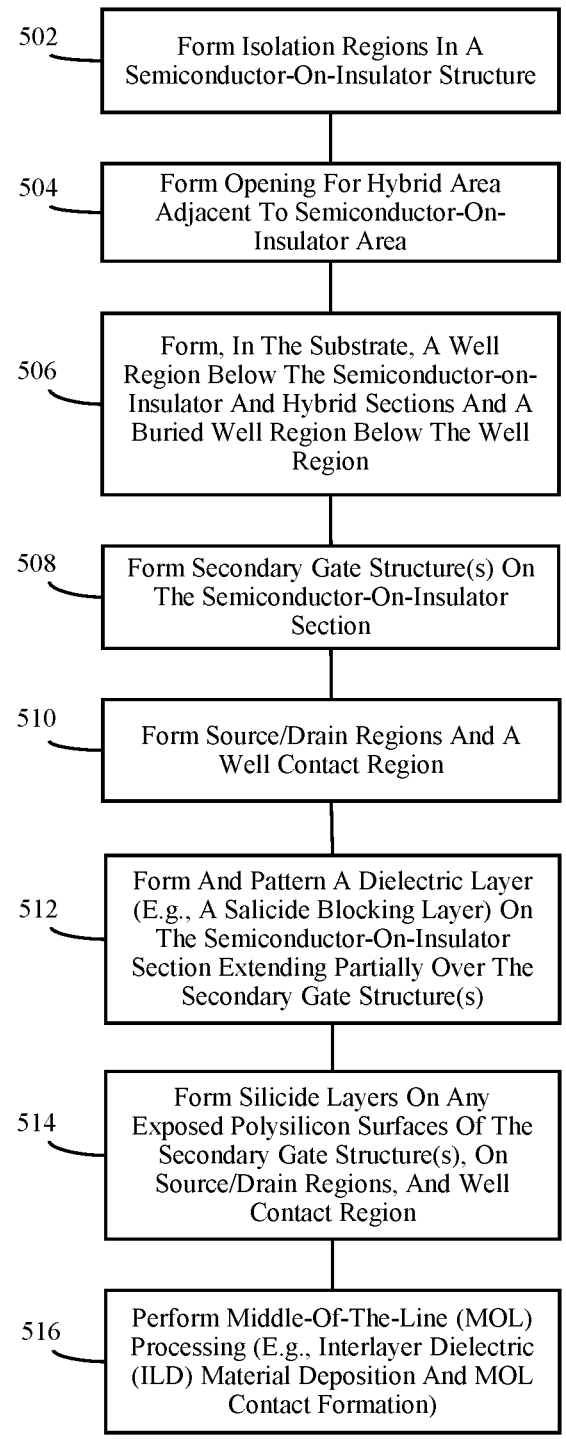
FIG. 5 is a flow diagram illustrating method embodiments for forming the disclosed semiconductor structure embodiments.

Referring to the flow diagram of FIG. 5, disclosed herein are embodiments of a method of forming a semiconductor structure, such as the semiconductor structure 100.1 of FIGS. 1A-1B or the semiconductor structure 100.2 of FIGS. 2A-2B, including a FET with an adjustable effective gate length.

Figure 6:
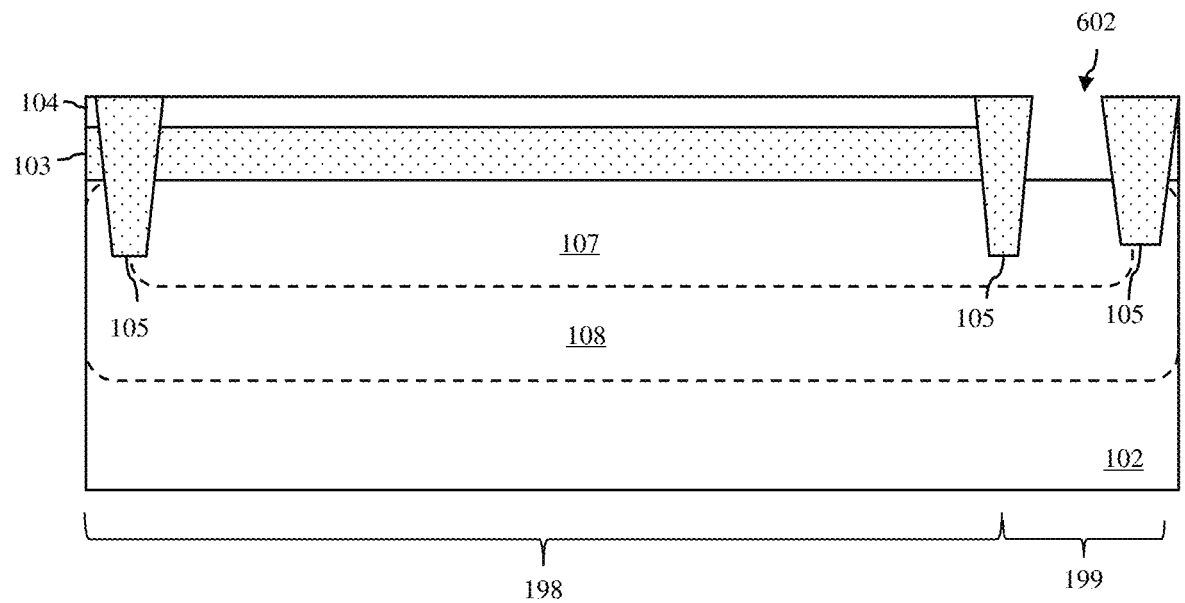
FIGS. 6-10 are cross-section diagrams illustrating partially completed semiconductor structures, respectively, formed according to the flow diagram of FIG. 5.

The method can, for example, include forming isolation regions 105 on an initial semiconductor-on-insulator structure (see process 502 and FIG. 6). The initial semiconductor-on-insulator structure can include a monocrystalline semiconductor substrate 102 (e.g., a monocrystalline silicon (Si) substrate or a monocrystalline substrate of some other suitable semiconductor material, such as silicon germanium (SiGe), germanium (Ge), etc.). The initial semiconductor-on-insulator structure can further include an insulator layer 103 on the semiconductor substrate 102. The insulator layer 103 can be a silicon dioxide ($SiO_2$) layer (also referred to herein as a buried oxide (BOX) layer) or a layer of some other insulator material suitable for use in a back gate structure. The insulator layer 103 can be relatively thin (e.g., 50 nm or less). The initial semiconductor-on-insulator structure can further include a monocrystalline semiconductor layer 104 on the insulator layer 103. The semiconductor layer 104 can be a monocrystalline Si layer or a monocrystalline layer of some other suitable semiconductor material (e.g., SiGe, Ge, etc.). The monocrystalline semiconductor layer 104 can also be also relatively thin (e.g., 22 nm or less).

The isolation regions can be formed in this initial semiconductor structure at process 502 using shallow trench isolation (STI) formation techniques in order to define the boundaries of what will be a hybrid area 199 for a well contact region and a semiconductor-on-insulator area 198 for an active device region and further to provide electrical isolation between the FET and other devices or components on the substrate. For example, trenches for the isolation regions 105 can be lithographically patterned and etched so that they extend from the top surface of the semiconductor layer 104 and through the insulator layer 103 and into the semiconductor substrate 102 and so that they define the boundaries of the active device region for the FET and a well contact region for the FET Following trench formation, one or more layers of isolation material (e.g., silicon dioxide ($SiO_2$) or any other suitable isolation material) can be deposited so as to fill the trenches. A chemical mechanical polishing (CMP) process can subsequently be performed to remove any of the isolation materials from the top surface of the semiconductor layer 104. For purposes of illustration, process 502 is illustrated in the figures with the hybrid area 199 being formed at one end of the semiconductor-on-insulator area 198 (e.g., corresponding to the semiconductor structure 100.1 shown in FIGS. 1A-1B). However, it should be understood that the figures are not intended to be limiting and that, alternatively, process 502 could be performed so that the hybrid area 199 is positioned to one side of the semiconductor-on-insulator area 198 (e.g., corresponding to the semiconductor structure 100.2 shown in FIGS. 2A-2B). The method can further include forming, in the semiconductor substrate 102, a well region 107 and, optionally, a buried well region 108 below the well region 107 (see process 504 and FIG. 6). For example, a first dopant implantation process can be performed to form a well region 107 in the semiconductor substrate 102 below the buried insulator layer 103 in both the semiconductor-on-insulator area 198 and hybrid area 199. It should be noted that the depth of the bottom of the well region 107 should be greater than the depth of the bottom of the isolation regions 105 such that the well region 107 is below the isolation region 105 that separates the two areas 198-199. Optionally, a second dopant implantation process can be performed to form a buried well region 108 within the semiconductor substrate below and wider than the well region 107. The well region 107 and the buried well region 108 can be doped to have different type conductivities and, thus, so that the buried well region 108 electrically isolates the well region 107 from a lower portion of the semiconductor substrate 102. Thus, for example, the well region 107 can be doped at process 504 to be an N-type well region (Nwell) and the buried well region 108 can be doped so as to be a P-type well region (Pwell) or vice versa.

The method can further include forming a mask over semiconductor-on-insulator area 198 such that the hybrid area 199 remains exposed. Then, a well contact opening 602 can be formed in the hybrid area 199 (see process 504 and FIG. 7). That is, the semiconductor material in the semiconductor-on-insulator area 198 can be protected by the mask and one or more etch processes can be performed to remove exposed portions of the semiconductor layer 104 and the buried insulator layer 103 below from the hybrid area 199, thereby forming the well contact opening 602. As illustrated, the etch process(es) can be performed such that the top surface of the semiconductor substrate 102 and, particularly, the well region 107 thereon is exposed. The mask formed at process 504 over the semiconductor-on-insulator area 198 can then be removed. The method can further include forming at least one secondary gate structure 125.1-125.2 on the semiconductor layer 104 in the active device region of the semiconductor-on-insulator area 198 (see process 508 and FIG. 7). To form the secondary gate structure(s), a mask can be formed over the well contact opening 602. Then, gate stack(s) for the secondary gate structure(s) can be formed. That is, a gate dielectric layer 126 can be deposited onto the top surface of the partially completed structure and a gate conductor layer 127 can be deposited onto the gate dielectric layer 126. In some embodiments, the secondary gate structure(s) can be high-K/metal gate structures. For example, the gate dielectric layer 126 can include an optional interfacial layer (e.g., a silicon oxynitride layer) and a high-K gate dielectric layer on the interfacial layer. Those skilled in the art will recognize that a high-K dielectric layer refers to a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide. The gate conductor layer can include, for example, at least one metal or metal alloy layer on the high K gate dielectric layer. The metal or metal alloy layer(s) can include, for example, a metal or metal alloy capping layer and an additional metal or metal alloy material layer suitable for dipole formation on the metal or metal alloy capping layer). The gate conductor layer 127 can, optionally, also include a doped polysilicon layer e.g., N-doped for an NFET or P-doped for a PFET) on the metal or metal alloy layer. Alternatively, the secondary gate structure(s) can include any other suitable combination of gate dielectric and gate conductor materials.

In any case, following deposition of the various gate dielectric and gate conductor materials, lithographic patterning and etch processes can subsequently be performed to form gate stack(s) for the secondary gate structure(s) 125.1-125.2 at desired locations on the active device region. Specifically, within the semiconductor-on-insulator area 198, the active device region of the semiconductor layer 104 will have designated source/drain (s/d) areas and a section 121 of the semiconductor layer 104 extends laterally between the s/d areas. This section 121 has end portions 20 adjacent to the s/d areas, respectively, and a center portion 10 therebetween. The gate stack(s) for the secondary gate structure(s) can be formed above and immediately adjacent to the end portion(s) 20 such that the s/d areas and center portion 10 remain uncovered. These gate stack(s) can further be lithographically patterned and etched to traverse the semiconductor layer widthwise, extending onto the adjacent isolation regions 105.

It should be noted that, for purposes of illustration, two secondary gate structures 125.1 and 125.2 are shown in the figures and the two secondary gate structures 125.1-125.2 have essentially equal lengths. However, it should be understood that the figures are not intended to be limiting. Alternatively, secondary gate structures with different lengths could be formed. Also, alternatively, a single secondary gate structure could be formed.

Figure 7:
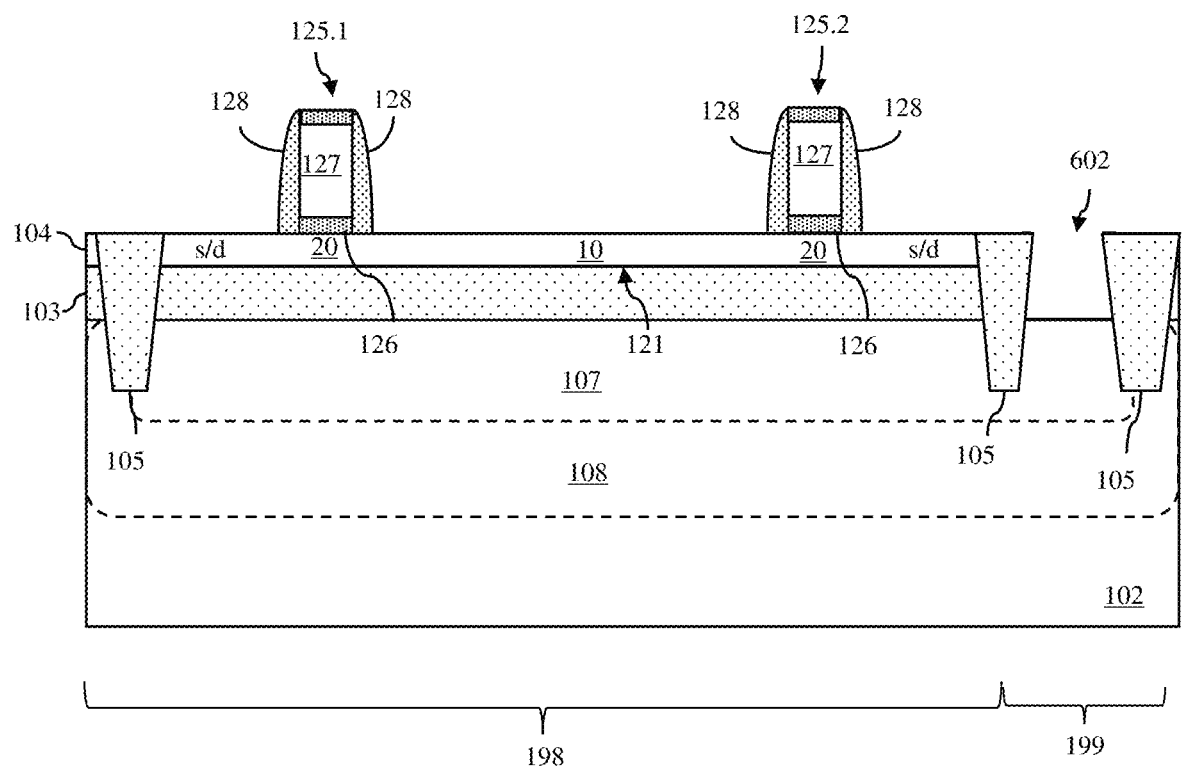

Gate sidewall spacers 128 can be formed on the secondary gate structure(s) 125.1-125.2 (see FIG. 7). Specifically, one or more layers of dielectric spacer material can be conformally deposited over the partially completed structure. The dielectric spacer material can be, for example, silicon dioxide, silicon oxynitride, or any other suitable dielectric spacer material. Then, a selective anisotropic etch process can be performed to remove the spacer material from horizontal surfaces, leaving it essentially intact as sidewall spacers on vertical surfaces. Thus, the gate sidewall spacers 128 are formed on opposing sidewalls of the gate stack(s) of the secondary gate structure(s) 125.1-125.2, each having an outer sidewall spacer adjacent to a corresponding s/d area and an inner sidewall spacer opposite the outer sidewall spacer. The mask formed at process 506 over the well contact opening 602 can then be removed.

Figure 8:
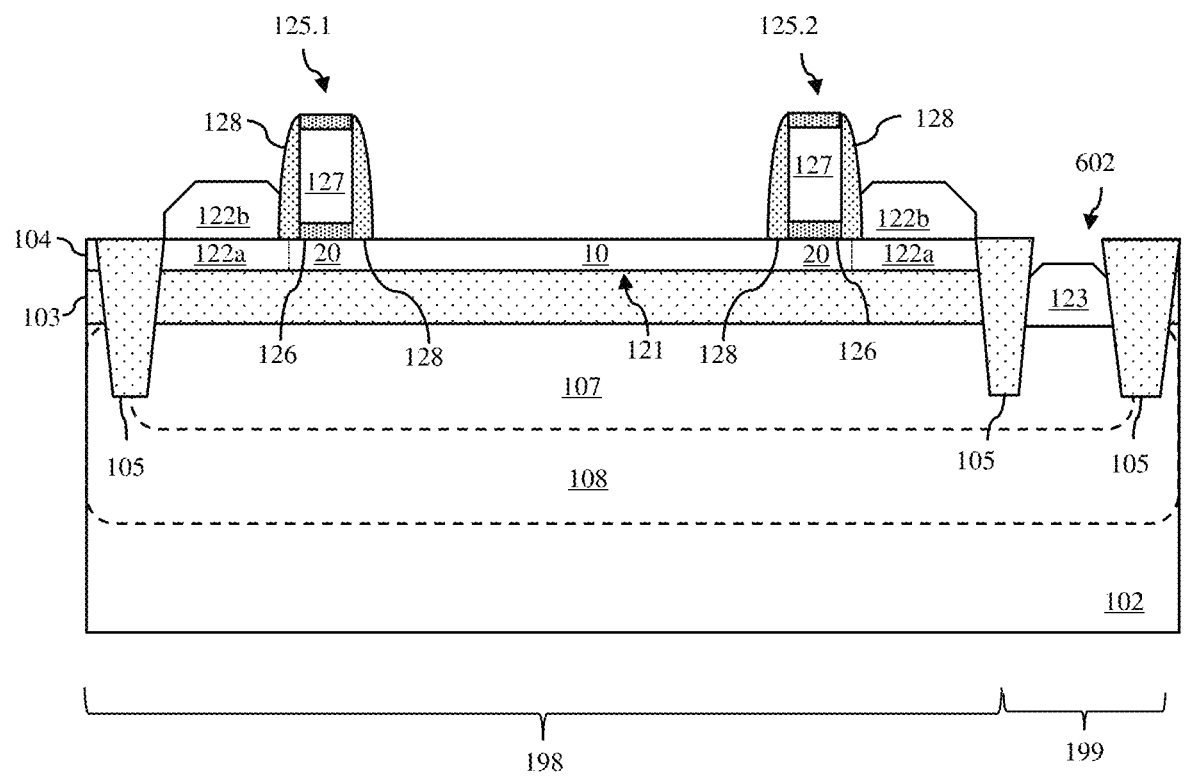

Source/drain regions 122 and a well contact region 123 can subsequently be formed in the s/d areas and the well contact opening 602 respectively (see process 510 and FIG. 8). For example, a mask can be formed over the center portion 10 of the section 121 of the semiconductor layer 104 in the semiconductor-on-insulator area 198 (e.g., between the secondary gate structures), leaving s/d areas exposed. In situ doped epitaxial growth process(es) can be performed to form doped epitaxial semiconductor layers 122b for the source/drain regions 122 on the s/d areas. These epitaxial semiconductor layers can include one or more layers of monocrystalline semiconductor material including the same semiconductor material as the semiconductor layer 104 or, alternatively, some other suitable semiconductor material. For an NFET, the epitaxial semiconductor layers 122b can be in situ doped to have N-type conductivity at a relatively high conductivity level, whereas, for a PFET, the epitaxial semiconductor layers 122b can be in situ doped so as to have P-type conductivity at a relatively high conductivity level.

It should be noted that, if the well region 107 formed at process 506 is an Nwell and the FET 120 being formed according to the method is an NFET or if the well region 107 formed at process 506 is a Pwell and the FET 120 being formed according to the method is a PFET, then the mask formed at process 510 can also leave the well contact opening 602 exposed and the same epitaxial deposition process used to form the epitaxial semiconductor layers for the source/drain regions and can be used to form an additional epitaxial semiconductor layer for a well contact region 123 within the well contact opening 602. Otherwise (e.g., if the well region 107 is an Nwell and the FET 120 being formed is a PFET or vice versa), then discrete masked epitaxial growth processes can be performed so that and the epitaxial semiconductor layer of the well contact region 123 has a different type conductivity than the epitaxial semiconductor layers 122b of source/drain regions 122.

Optionally, an anneal process (e.g., a rapid thermal anneal (RTA) process) can be performed so as to cause dopants from the epitaxial semiconductor layers 122b of the source/drain regions 122 to diffuse into portions of the semiconductor layer 104 below, thereby forming, for the source/drain regions 122, optional doped portions 122a of the semiconductor layer 104 below the epitaxial semiconductor layers 122b. The optional doped portions 122a can extend the full thickness of the semiconductor layer 104 so that they are above and immediately adjacent to the insulator layer 103, as illustrated. Alternatively, the optional doped portion 122a can extend into the semiconductor layer 104 to some depth above the level of the top surface of the insulator layer 103. It should be noted that the section 121 of the semiconductor layer 104 extending laterally between the doped portions 122a can be an intrinsic portion (i.e., an undoped portion). Alternatively, this section 121 can have been doped during previous processing so as to have a different type conductivity than the source/drain regions at a relatively low conductivity level (e.g., P− conductivity in the case of an NFET or N− conductivity in the case of a PFET). Following formation of the source/drain regions 122 and well contact region 123, any remaining masks and, optionally, any dielectric gate cap(s) on the secondary gate structure(s) can be removed.

Figure 9:
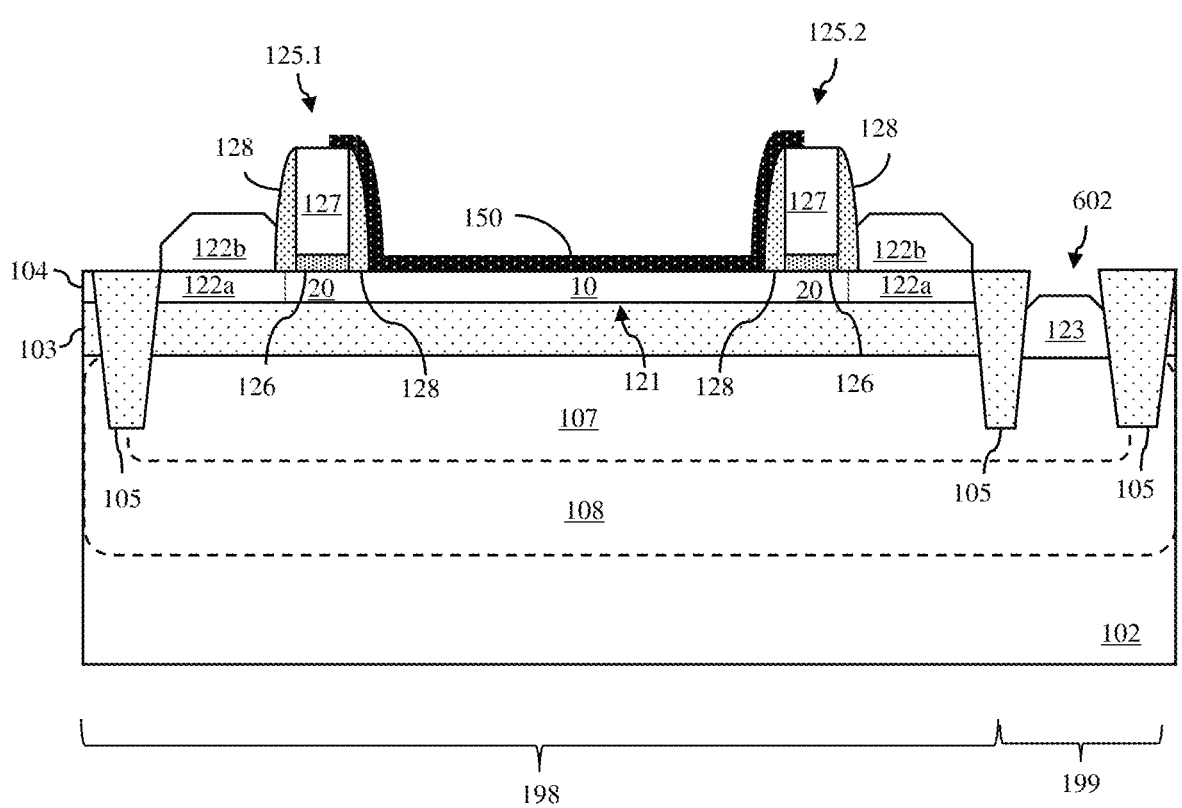

The method can further include forming a relatively thin conformal dielectric layer 150 on the exposed center portion 10 of the section 121 of the semiconductor layer 104 adjacent to the secondary gate structure(s) and, optionally, extending laterally partially over the secondary gate structure(s) (see process 512 and FIG. 9). That is, a relatively thin conformal dielectric layer 150 can be formed (e.g., deposited, grown, or otherwise formed) over the partially completed structure. The dielectric layer 150 can be, for example, a self-aligned silicide blocking layer made of, for example, silicon nitride, silicon carbon nitride, or any other suitable self-aligned silicide blocking material. A mask can be formed on the dielectric layer 150 and lithographically patterned so that it continues to protect the portion of the dielectric layer 150 above and immediately adjacent the center portion 10 and further extending laterally onto the inner sidewall spacer and at least partially over each secondary gate structure 125.1-125.2. If, as illustrated, the partially completed structure includes a pair of secondary gate structures 125.1-125.2, this mask can be patterned to extend laterally entirely across the center portion 10 and onto both secondary gate structures 125.1-125.2. However, it should be understood that, if the partially completed structure only includes a single secondary gate structure, the mask would be patterned to extend from one s/d area across the semiconductor layer and onto the secondary gate structure on the opposite side. A selective etch process can subsequently be performed to remove exposed portions of the dielectric layer 150 from the source/drain regions 122, from the well contact region 123, and, optionally, form all or a portion of the top surface of the secondary gate structure(s) 125.1-125.2. It should be noted that the material of the dielectric layer 150 should be different from the material of the gate sidewall spacers 128 so that, during this selective etch process, portions of the dielectric layer 150 can be selectively removed without significantly etching away gate sidewall spacer material. Furthermore, if any gate cap material remains on the top of the secondary gate structure(s) prior to process 510 and is exposed during patterning of the dielectric layer 150, the exposed gate cap material can also be selectively removed during patterning of the dielectric layer 150. The mask formed at process 510 on the dielectric layer 150 can then be removed.

Figure 10:
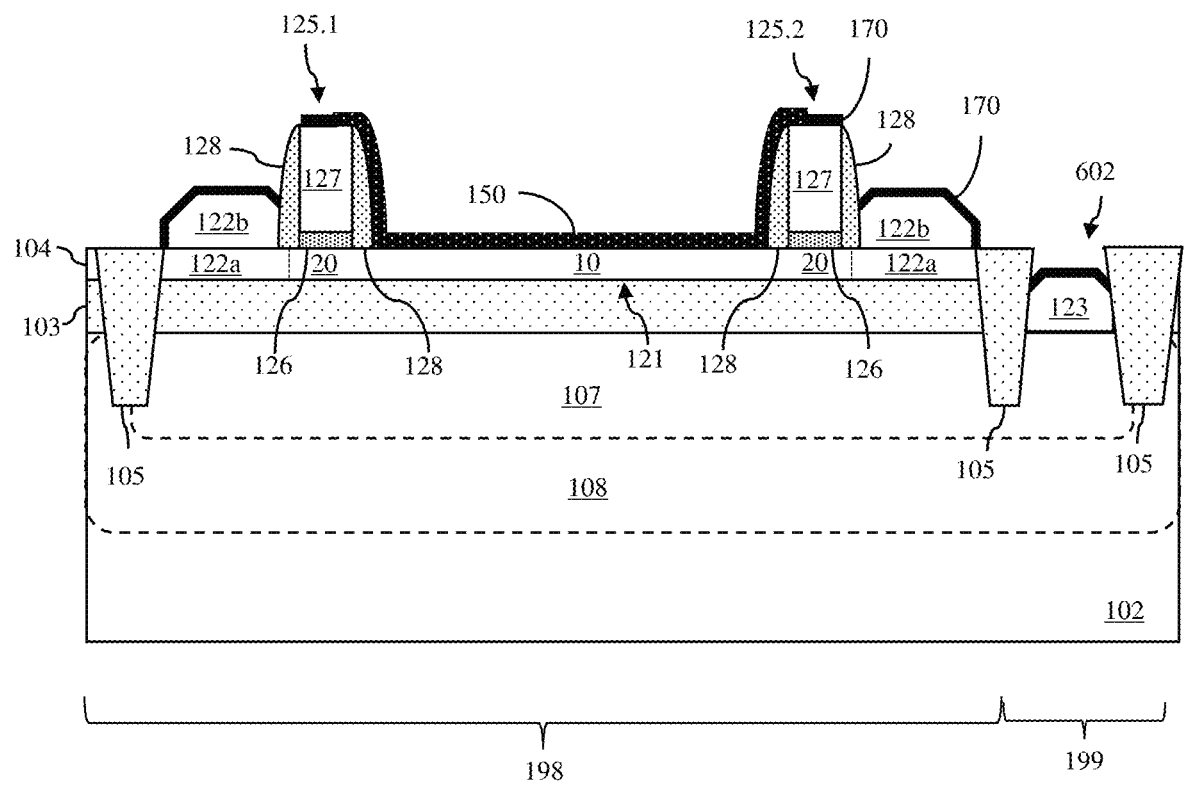

Optionally, the method can include forming metal silicide layers 170 on exposed silicon or polysilicon surfaces including, but not limited to, on the source/drain regions 122, on doped polysilicon of the secondary gate structure(s) 125.1-125.2 (if applicable), and on the well contact region 123 (see process 514 and FIG. 10). The silicide layers 170 could be, for example, layers of cobalt silicide, nickel silicide, tungsten silicide, titanium silicide, or a silicide of any other suitable metal or metal alloy material. Techniques for forming metal silicide layers are well known in the art and, thus, the details thereof have been omitted form this specification to allow the reader to focus on the salient aspects of the disclosed embodiments.

The method can further include performing middle-of-the-line (MOL) processing (see process 516 and the semiconductor structures 100.1-100.2 of FIGS. 1A-1B and 2A-2B). For example, MOL dielectric layer(s) 180 can be formed (e.g., grown, deposited, or otherwise formed) to cover the partially completed structure shown in FIG. 10). The MOL dielectric layer(s) 180 can include, for example, an etch stop layer and a blanket interlayer dielectric (ILD) material layer on the etch stop layer. The etch stop layer can be, for example, a relatively thin conformal silicon nitride layer or a relatively thin conformal layer of some other suitable etch stop material. The ILD material layer can be, for example, a blanket layer of silicon dioxide, a doped silicon glass (e.g., phosphosilicate glass (PSG) or borophosphosilicate glass (BPSG)), or a blanket layer of any other suitable ILD material. MOL contacts (e.g., see contacts 182, 183, and 185) can be formed to the various terminals of the FET 120 using conventional MOL contact formation techniques.

The method as described above is provided for illustration purposes and is not intended to be limiting. For example, alternatively, the order within which one or more of the components of the FET described above are formed can be different than the order set forth in the flow diagram of FIG. 5 and/or different techniques can be used to form one or more of those components.

In the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises", "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   an insulator layer on a semiconductor substrate;
   above the insulator layer, source/drain regions and a section of a semiconductor layer extending laterally between the source/drain regions, wherein the section of the semiconductor layer has end portions adjacent to the source/drain regions and a center portion positioned laterally between the end portions;
   a primary gate structure comprising: the insulator layer and a well region in the semiconductor substrate adjacent to the insulator layer opposite at least the section of the semiconductor layer extending laterally between the source/drain regions; and
   at least one secondary gate structure on at least one of the end portions,
   wherein the at least one secondary gate structure is offset from the center portion and from an adjacent source/drain region of the source/drain regions,
   wherein the at least one secondary gate structure comprises two secondary gate structures on the end portions, respectively, adjacent to the source/drain regions, and
   wherein the structure further comprises:
      inner and outer gate sidewall spacers on the secondary gate structures;
      a dielectric layer immediately adjacent to and covering the center portion and further extending partially over the secondary gate structures; and
      interlayer dielectric material on the dielectric layer.

2. The structure of claim 1, further comprising voltage sources connected to the secondary gate structures, wherein the voltage sources enable biasing of the secondary gate structures to establish an effective gate length equal to a length of the center portion between the end portions.

3. The structure of claim 1, further comprising voltage sources connected to the secondary gate structures, wherein the voltage sources enable independent biasing of the secondary gate structure to establish any of a first effective gate length, a second effective gate length that is less than the first effective gate length, and a third effective gate length that is less than the second effective gate length, wherein the first effective gate length equal to a length of the section of the semiconductor layer extending laterally between the source/drain regions and wherein the structure has the first effective gate length when none of the secondary gate structures are biased, wherein the second effective gate length equals a combined length of one end portion and the center portion and wherein the structure has the second effective gate length when one secondary gate structure is biased and one end portion is conductive, and wherein the third effective gate length is equal to a length of the center portion and wherein the structure has the third effective gate length when the secondary gate structures are biased and the end portions are conductive.

4. The structure of claim 1, further comprising contacts to the well region and the secondary gate structures.

5. The structure of claim 1, further comprising silicide layers on the source/drain regions and partially covering top surfaces of the secondary gate structures.

6. The structure of claim 1,
wherein the section of the semiconductor layer extending laterally between the source/drain regions comprises an intrinsic portion, and
wherein the source/drain regions comprise doped portions of the semiconductor layer and doped epitaxial semiconductor layers on the doped portions of the semiconductor layer.

7. The structure of claim 1, further comprising a well contact region on the well region, wherein the well contact region and the well region have a same type conductivity as the source/drain regions.

8. The structure of claim 1, further comprising a well contact region on the well region, wherein the well contact region and the well region have a different type conductivity than the source/drain regions.

9. A structure comprising:
an insulator layer on a semiconductor substrate;
above the insulator layer, source/drain regions and a section of a semiconductor layer extending laterally between the source/drain regions, wherein the section of the semiconductor layer has end portions adjacent to the source/drain regions and a center portion positioned laterally between the end portions;
a primary gate structure comprising: the insulator layer and a well region in the semiconductor substrate adjacent to the insulator layer opposite at least the section of the semiconductor layer extending laterally between the source/drain regions;
secondary gate structures on the end portions, respectively, wherein each secondary gate structure of the secondary gate structures is offset from and between the center portion and an adjacent source/drain region of the source/drain regions;
inner and outer gate sidewall spacers on the secondary gate structures;
a dielectric layer immediately adjacent to and covering the center portion and further extending partially over the secondary gate structures; and
interlayer dielectric material on the dielectric layer.

10. The structure of claim 9, further comprising voltage sources connected to the secondary gate structures, wherein the voltage sources enable biasing of the secondary gate structures to establish an effective gate length equal to a length of the center portion between the end portions.

11. The structure of claim 9, further comprising voltage sources connected to the secondary gate structures,
wherein the voltage sources enable independent biasing of the secondary gate structure to establish any of a first effective gate length, a second effective gate length that is less than the first effective gate length, and a third effective gate length that is less than the second effective gate length, wherein the first effective gate length equal to a length of the section of the semiconductor layer extending laterally between the source/drain regions and wherein the structure has the first effective gate length when none of the secondary gate structures are biased, wherein the second effective gate length equals a combined length of one end portion and the center portion and wherein the structure has the second effective gate length when one secondary gate structure is biased and one end portion is conductive, and wherein the third effective gate length is equal to a length of the center portion and wherein the structure has the third effective gate length when the secondary gate structures are biased and the end portions are conductive.

12. The structure of claim 9,
wherein the section of the semiconductor layer extending laterally between the source/drain regions comprises an intrinsic portion, and
wherein the source/drain regions comprise doped portions of the semiconductor layer and doped epitaxial semiconductor layers on the doped portions of the semiconductor layer.

13. The structure of claim 9, further comprising a well contact region on the well region, wherein the well contact region and the well region have a same type conductivity as the source/drain regions.

14. The structure of claim 9, further comprising a well contact region on the well region, wherein the well contact region and the well region have a different type conductivity than the source/drain regions.

* * * * *